(12) United States Patent
Ueki et al.

(10) Patent No.: US 8,558,334 B2
(45) Date of Patent: Oct. 15, 2013

(54) SEMICONDUCTOR DEVICE AND METHOD OF MANUFACTURING THE SEMICONDUCTOR DEVICE

(75) Inventors: Makoto Ueki, Kanagawa (JP); Naoya Inoue, Kanagawa (JP); Yoshihiro Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/399,475

(22) Filed: Feb. 17, 2012

(65) Prior Publication Data

US 2012/0228728 A1  Sep. 13, 2012

(30) Foreign Application Priority Data

Mar. 7, 2011  (JP) .................................. 2011-049236

(51) Int. Cl.
| | |
|---|---|
| H01L 29/82 | (2006.01) |
| H01L 23/552 | (2006.01) |
| H01L 27/08 | (2006.01) |
| H01L 21/00 | (2006.01) |

(52) U.S. Cl.
USPC ................ 257/421; 257/659; 257/531; 438/3

(58) Field of Classification Search
USPC .................................................. 257/421, 295
See application file for complete search history.

(56) References Cited

U.S. PATENT DOCUMENTS

| 6,667,526 B2 | 12/2003 | Komori |
| 2010/0188890 A1 | 7/2010 | Fukami et al. |

FOREIGN PATENT DOCUMENTS

| JP | 2003-174149 A | 6/2003 |
| JP | 2009-224477 A | 10/2009 |
| WO | WO 2009/001706 A1 | 12/2008 |

*Primary Examiner* — Long K Tran
*Assistant Examiner* — Dzung Tran
(74) *Attorney, Agent, or Firm* — Foley & Lardner LLP

(57) ABSTRACT

A semiconductor device in which MRAM is formed in a wiring layer A contained in a multilayered wiring layer, the MRAM having at least two first magnetization pinning layers in contact with a first wiring formed in a wiring layer and insulated from each other, a free magnetization layer overlapping the two first magnetization pinning layers in a plan view, and connected with the first magnetization pinning layers, a non-magnetic layer situated over the free magnetization layer, and a second magnetization pinning layer situated over the non-magnetic layer.

10 Claims, 13 Drawing Sheets

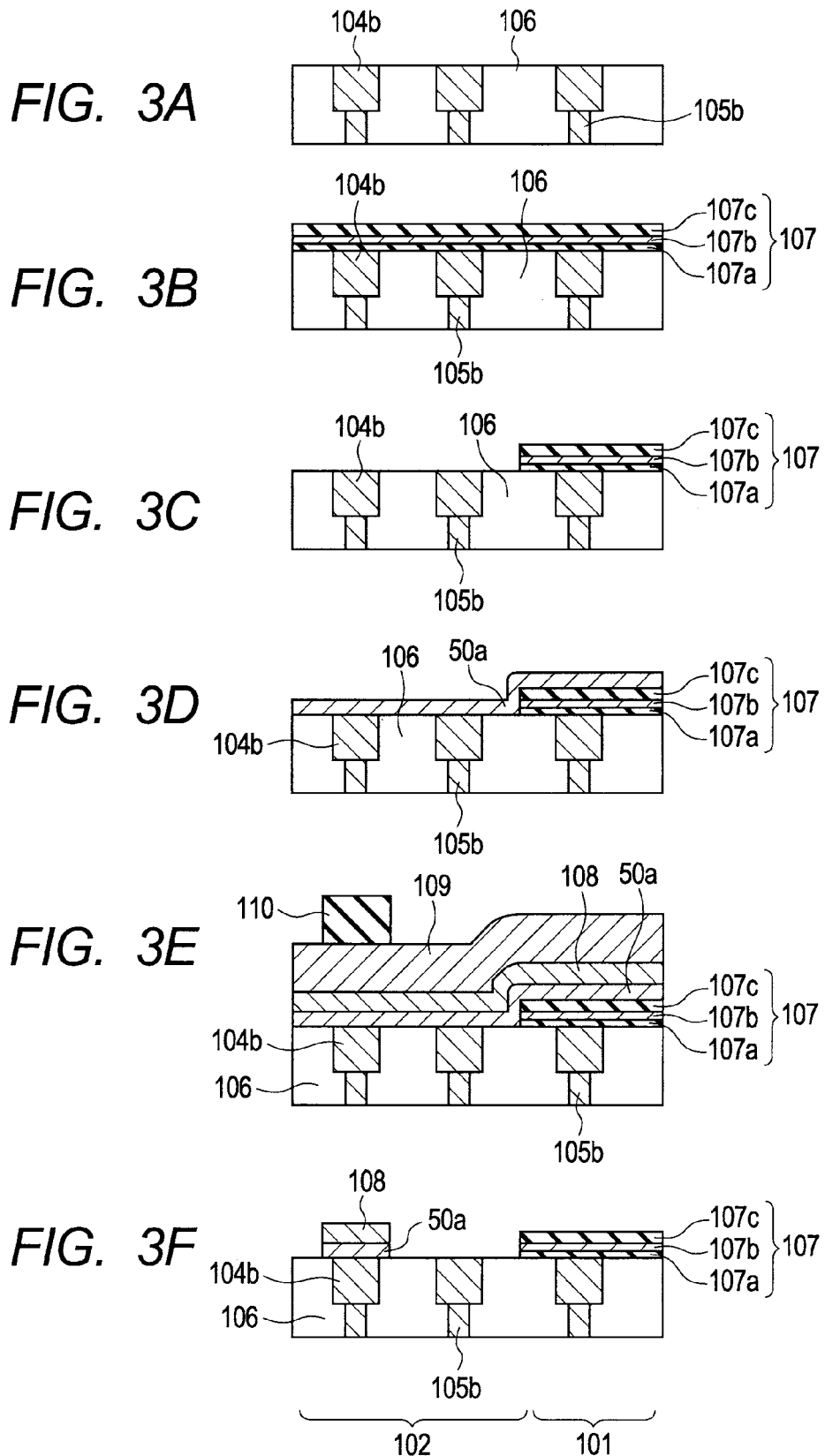

PRIOR ART

PRIOR ART

SEMICONDUCTOR DEVICE AND METHOD OF MANUFACTURING THE SEMICONDUCTOR DEVICE

CROSS-REFERENCE TO RELATED APPLICATIONS

The disclosure of Japanese Patent Application No. 2011-49236 filed on Mar. 7, 2011 including the specification, drawings, and abstract is incorporated herein by reference in its entirety.

BACKGROUND

The present invention concerns a semiconductor device and a method of manufacturing the semiconductor device.

For example, International Laid-Open Publication WO2009-001706 discloses a magnetoresistive random access memory (MRAM) utilizing a current driven magnetic domain wall motion.

FIG. 12 shows a configuration of an MRAM disclosed in International Laid-Open Publication WO2009-001706. The MRAM has first magnetization pinning layers 5a, 5b, a second magnetization pinning layer 6, a non-magnetic layer 4, and a free magnetization layer. The free magnetization layer has a magnetization pinned regions 1a, 1b, a magnetic domain wall moving region 3, and magnetic domain wall pinning sites 2a, 2b. The second magnetization pinning layer 6 is disposed so as to overlap at least a portion of the magnetic domain wall moving region. Each of the free magnetization layer, the first magnetization pinned layers 5a, 5b, and the second magnetization pinning layer 6 comprises a ferromagnetic material and shows magnetization indicated by the direction of arrows. That is, the first magnetization pinning layers 5a, 5b have pinning magnetization anti-parallel to each other, and the second magnetization pinning layer 6 has pinning magnetization in parallel to the first magnetization pinning layer 5a or 5b.

The magnetic domain wall moving region 3 of the free magnetization layer can be optionally switched for magnetization in accordance with writing of current and serves for writing information. The magnetization pinned regions 1a, 1b of the free magnetization layer are disposed in adjacent with the first magnetization pinning layers 5a, 5b by which the magnetization pinned regions 1a and 1b have magnetization anti-parallel to each other.

Further, a magnetic domain wall is formed to the magnetic domain wall pinning site 2a or 2b in accordance with the direction of magnetization of the magnetic domain wall moving region. The magnetic wall pinning site has a function of stably fixing the magnetic domain wall when a magnetic field or current is not applied. It has been theoretically found that the magnetic domain wall pinning sites 2a, 2b in the free magnetization layer can spontaneously fix the magnetic domain wall with no provision of particular structure.

Japanese Unexamined Patent Application Publication No. 2003-174149 discloses the structure of magnetoresistive random access memory (MRAM) suitable to refinement and integration.

The MRAM comprises a cylindrical first magnetic body capable of changing the magnetization direction and opened at one end and a columnar second magnetic body fixed in one peripheral direction for the direction of magnetization and formed in the cylinder of the first magnetic body by way of an insulating layer. A rotating magnetic field is generated by flowing a tunnel current between the first and second magnetic bodies to set the direction of magnetization of the first magnetic body to one or another peripheral direction, and utilize the change of the magnetic resistance depending on the direction of magnetization of the first magnetic body to the direction of magnetization of the second magnetic body as binary signals.

Japanese Unexamined Patent Application Publication No. 2009-224477 discloses a magnetic memory unit having an MRAM and a manufacturing method thereof.

Specifically, it relates to a structure of an MRAM containing a magnetization pinning layer, a non-magnetic spacer layer formed over the magnetization pinning layer, and a free magnetization layer formed over the non-magnetic spacer layer in which the magnetization pinning layer and the free magnetization layer are adjacent to each other with a non-magnetic spacer layer being interposed therebetween in a device region of the magnetization pinning layer except for the peripheral portion, and the magnetization pinning layer and the free magnetization layer are spaced apart on the peripheral portion of the magnetization fixing layer.

SUMMARY

In recent years, Foundry development has been promoted in the advanced LSI production and it has been demanded to obtain a hybridized MRAM on a common logic IP (Intellectual Property). When the MRAM is formed in a wiring layer, it is necessary that the process for forming a multilayered wiring for LSI does not fluctuate characteristics of the MRAM and the process for forming the MRAM does not fluctuate characteristics of the multilayered wiring.

FIG. 13 shows a drawing disclosed in International Laid-Open Publication WO2009-001706. The drawing shows an example of forming the MRAM disclosed in FIG. 12 in a multilayered wiring layer. Specifically, an MRAM is formed over a contact 8 formed over a lower layer wiring 9. In the example shown in the drawing, the height of the contact 7 in a region where the MRAM is not situated is higher than the height of a contact in other layer in the layer in which the MRAM is introduced. That is, the presence of the MRAM gives an effect on the multilayered wiring structure.

When the height of the contact 7 is large, since a metal material is difficult to be buried and, in addition, parameters of resistance and capacitance of the wiring are different from those of usual logic IP, this results in a problem of additionally requiring, construction of design circumstance.

The techniques described in Japanese Unexamined Patent Application Publication No. 2003-174149 and Japanese Unexamined Patent Application Publication No. 2009-224477 relate to an MRAM of a device structure different from that of the magnetic domain wall moving type MRAM.

According to one aspect of the present invention, there is provided a semiconductor device having a multilayered wiring layer formed over a substrate, in which a first layer contained in the multilayered wiring layer has a first interlayer insulating film, a plurality of first via holes buried in the first interlayer insulating film, and a plurality of first wirings buried in the first interlayer insulating film connected with the first via holes and exposed at the surface from the first interlayer insulating film, and a second layer contained in the multilayered wiring layer and situated just over the first layer has, in a second region, an MRAM having at least two first magnetization pinning layers in contact with the first wiring and insulated from each other, a free magnetization layer overlapping the two first magnetization pinning layer in a plan view and connected with the first magnetization pinning layers, a non-magnetic layer situated over the free magnetization layer, and a second magnetization pinning layers situated over the non-magnetic layer, a second interlayer insulating film covering the MRAM, a second via hole buried in the second interlayer insulating film and connected with the second magnetization pinning layers, and a second wiring buried in the second interlayer insulating film, connected with the second via hole, and exposed at the surface from the second interlayer insulating film.

According to another aspect of the present invention, there is provided a method of manufacturing a semiconductor device including: a first step of forming a first interlayer insulating film over a substrate and then burying a plurality of first via holes and first wirings in the first interlayer insulating film so as to expose the first wirings thereby forming a first layer; a second step of forming at least two first magnetization pinning layers electrically insulated from each other over the first wiring in a first region over the first layer; a third step of completing an MRAM by forming a free magnetization layer overlapping the two first magnetization pinning layers in a plan view, and electrically connected with the first magnetization pinning layers, a non-magnetic layer situated over the free magnetization layer, and a second magnetization pinning layers situated over the non-magnetic layer; a fourth step of forming a second interlayer insulating film covering the MRAM; and a fifth step of burying a second via hole connected with the second magnetization pinning layer and a second wiring connected with the second via hole in the second interlayer insulating film.

In the present the invention, MRAM is formed in contact with the wirings in the lower layer. That is, in the present invention, the contact (or via hole) is not situated between the wiring in the lower layer and the MRAM different from the existent technique shown in FIG. 13. According to the invention, since the thickness of the layer in which the MRAM is formed can be reduced by so much as the contact (or via hole) is not intervened, the height of the layer can be made identical with the height of the layer in which the MRAM is not formed. In this case, the height of the wiring and that of the via hole formed in each of the layer can also be made identical. As a result, this can avoid a disadvantage that the multilayered wiring structure on the side of the logic is changed due to the MRAM formed in the multilayered wiring layer.

The invention can decrease or mitigate the disadvantage in the logic hybridized MRAM that the process for forming the multilayered wiring of LSI fluctuates the characteristic of the MRAM and a disadvantage that the process for forming MRAM changes the characteristic of the multilayered wirings.

BRIEF DESCRIPTION OF THE DRAWINGS

FIG. 3A to FIG. 3F show an example of a manufacturing flow chart of a semiconductor device of this embodiment;

FIG. 11A shows schematic views in which FIG. 11A is a schematic view for magnetic field writing type MRAM and FIG. 11B is a schematic view for a magnetic domain wall moving type MRAM;

DETAILED DESCRIPTION

The present invention is to be described by way of preferred embodiments with reference to the drawings. Throughout the drawings, identical constituent elements carry the same references for which descriptions may be saved optionally.

First Embodiment

The present inventors have found the following points to be taken into consideration for attaining a logic-hybridized MRAM capable of satisfying that a process for forming a multilayered wiring for LSI does not fluctuate characteristics of the MRAM and the a process for forming MRAM does not fluctuate characteristics of the multilayered wiring.
(1) Logic IP and Device Parameters are Matched That is, a multilayered wiring structure on the side of the logic, for example, the height of a wiring layer, the height of a wirings and a via hole, or the material for them should not be changed by a MRAM formed in the multilayered wiring. The device parameters are, for example, values of resistance and capacitance in the wiring layer. In the circuit design, design is performed generally based on the device parameters provided from side of the device. When the depth of the via hole increases, since the distance between upper and lower wirings changes it may be a possibility this gives of an effect on the capacitance value or the via hole resistance value between the upper and lower wirings. When the resistance or the capacitance is displaced, there may be a possibility of resulting in troubles in the circuit operation due to displacement of signal timing.
(2) Requirement for the Barrier Coating to MRAM Due to diffusion and intrusion of Cu as the wiring material and moisture in the BEOL process into the MRAM region, characteristics of the MRAM may be possibly deteriorated, or logic characteristics may be deteriorated sometimes by the diffusion of metal element constituting the MRAM. Then, such disadvantages are overcome in this embodiment by covering the MRAM with the barrier coating. Naturally, it is necessary that the barrier coating does not change the multilayered wiring structure or the material arrangement on the side of the logic.

Description is to be made on the embodiment satisfying the points described above.
<Configuration of Semiconductor Device>

Figure 1:
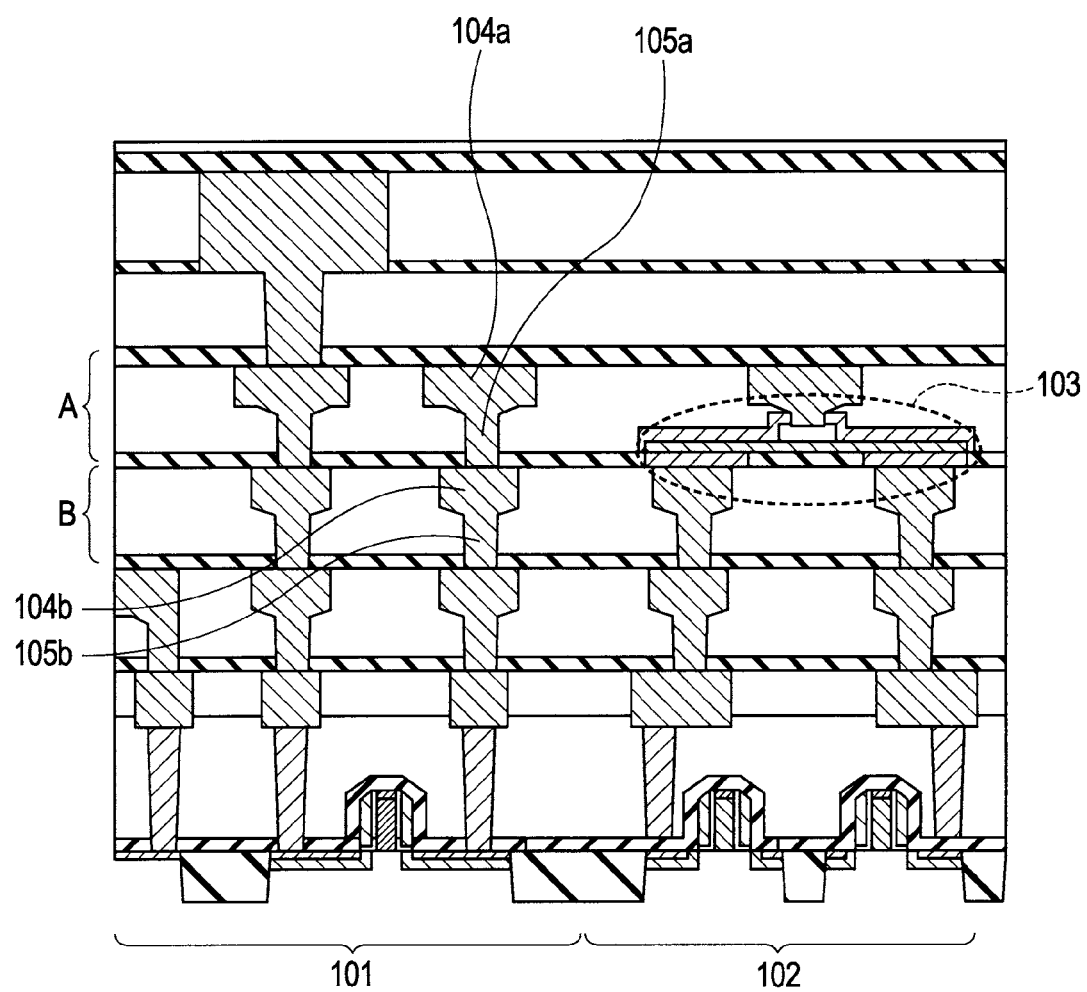
FIG. 1 shows an example of a cross sectional view of a semiconductor device according to a preferred embodiment.

FIG. 1 shows an example of a cross sectional view of a semiconductor device 100 in this embodiment. The illustrated semiconductor device 100 has a CMOS logic region (second region) 101 and an MRAM cell region (first region) 102. The drawing shows an example in which a MRAM 103 is formed in the wiring layer A (second layer). In this embodiment, the height of the wiring layer A in which the MRAM 103 is formed is identical with the height of a wiring layer B in which the MRAM 103 is not formed (first layer). Accordingly, in the CMOS logic region 101, the height of a wiring (third wiring) 104a and a via hole (third via hole) 105a formed in the wiring layer A is identical with the height of a wiring (first wiring) 104b and a via hole (first via hole) 105b formed in the wiring layer B. "identical" means herein that there is no difference exceeding the range of variation of manufacturing margin. This is identical also in the followings.

Figure 2A:
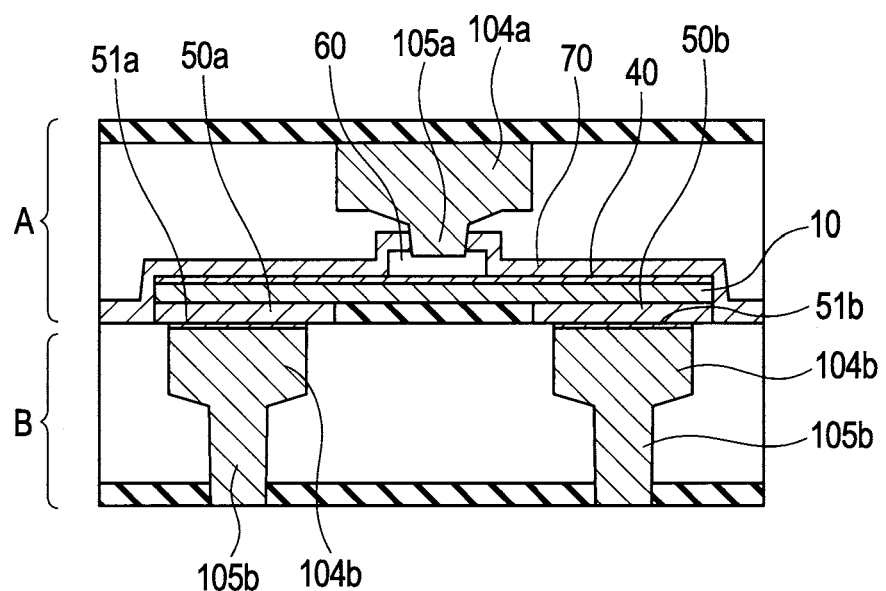
FIG. 2 shows an example of a cross sectional view of a semiconductor device according to a preferred embodiment.
Figure 2B:
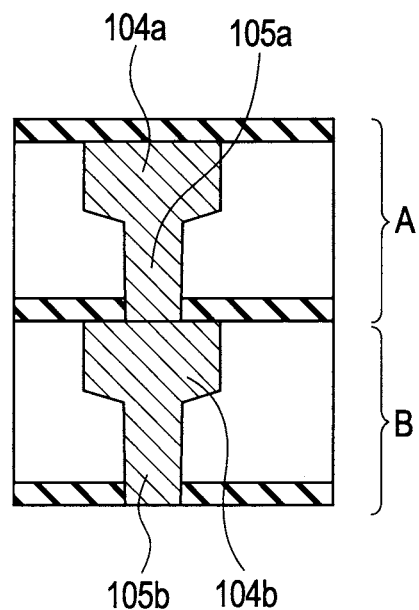

Then, FIG. 2A and FIG. 2B show enlarged cross sectional views extracting a main portion of the wiring layer A and the wiring layer B. FIG. 2A shows the MRAM cell region 102 and FIG. 2B shows the CMOS logic region 101.

As shown in FIG. 2A, an MRAM is formed in a wiring layer A of an MRAM cell region 102. The MRAM includes at least two first magnetization pinning layers 50a and 50b in contact with a wiring 104b of a wiring layer B and insulated from each other, a free magnetization layer 10 overlapping the two first magnetization pinning layers 50a and 50b in a plan view (for example, including the first magnetization pinning layers 50a and 50b) and electrically connected with the first magnetization pinning layers 50a and 50b, a non-magnetic layer 40 situated over the free magnetization layer 10, and a second magnetization pinning layer 60 situated over the non-magnetic layer. The lateral side and the upper surface of the MRAM are covered with a protective film 70. The wiring 104b in contact with the first magnetization pinning layers 50a and 50b is connected with an external circuit.

For the first magnetization pinning layers 50a and 50b, an alloy of Pt and Co., a stacked film formed by alternately stacking Pt and Co., etc. are used. The ferromagnetic body used herein is not restricted to them and any ferromagnetic body may be used so long as magnetization can be provided in the vertical direction. Further, conductive films 51a and 51b containing Ta or Ti are disposed preferably as a barrier film for suppressing diffusion of the ferromagnetic material at the lowermost layer of the ferromagnetic body. The barrier film can be regarded as a portion of the magnetization pinning layer.

For the free magnetization layer 10, an alloy of Co and Ni, a stacked film formed by alternately stacking Co and Ni, etc. are used. The ferromagnetic body used herein is not restricted to them and any ferromagnetic body may be used so long as magnetization can be provided in the vertical direction. Further, it is necessary to insert a coupling layer (not illustrated) between the free magnetization layer 10 and the first magnetization pinning layers 50a and 50b for ensuring the conductivity and coupling the magnetization of the first magnetization pinned layers 50a and 50b to the free magnetization layer 10. For the coupling layer, an alloy layer containing at least two or more of elements of Pt, Co, Fe, Ni, and Ta, an amorphous magnetic film comprising CoNiB, CoFeB. CoFeZr, CoNiZr, NiFB, NiFeZr, etc., or a stacked film thereof is used.

For the non-magnetic layer 40, insulators, semiconductors, metals, etc. can be used, and metal oxides, for example, MgO and AlO are used preferably.

For the second magnetization pinning layer 60, an alloy of Pt, Co, Ru, or a stacked film formed by optionally stacking Pt, Co, and Ru, etc. may be used. The ferromagnetic body used herein is not restricted to them but any ferromagnetic body may be used so long as vertical magnetization can be provided.

The protective film 70 comprises SiN, SiCN, or a stacked film thereof. While the protective film 70 preferably covers the lateral side and the upper surface of the MRAM as shown in FIG. 2A, a certain effect can be obtained so long as at least a portion of the lateral side and the upper surface of the MRAM are covered.

The configuration of the MRAM of this embodiment described above is identical with that of the MRAM described in International Laid-Open Publication WO2009-001706. Accordingly, detailed descriptions for the action, function, and the effect of the MRAM of this embodiment are to be omitted.

As shown in FIG. 2B in the CMOS logic 101, the height of the wiring 104a and the via hole 105a formed in the wiring layer A are identical with the height of the wiring 104b and via hole 105b formed in the wiring layer B.

<Method of Manufacturing a Semiconductor Device>

Then, an example of a method of manufacturing the semiconductor device 100 of this embodiment as described above is to be described with reference to FIG. 3A to FIG. 3F, FIG. 4G to FIG. 4L, FIG. 5M to FIG. 5P, and FIG. 6Q to FIG. 6S. The drawings are cross sectional views showing the flow of manufacturing the semiconductor device 100 of this embodiment, in which an MRAM cell region 102 is formed on the left and a CMOS logic region 101 is formed on the right of the drawings.

At first, as shown in FIG. 3A, a via hole (first via hole) 105b and a wiring (first wiring) 104b are formed in a first interlayer insulating film 106 formed over a substrate (not illustrated) by utilizing a usual process for forming a multilayered wiring (dual damascene) process. The drawing shows a state in which Cu as the via hole (first via hole) 105b and the wiring (first wiring) 104b are buried in a first interlayer insulating film 106 and then planarized subsequently by CMP.

Then, as shown in FIG. 3B, a stacked cap film 107 is formed over the first interlayer insulating film 106 in which Cu is buried. The stacked cap film 107 comprises, for example, SiN (or SiCN) film 107c/SiO$_2$ film 107b/SiCN film 107a successively from above. Then, as shown in FIG. 3C, the stacked cap film 107 of the MRAM cell region 102 is removed by photolithography and dry etching to expose the wiring (first wiring) 104b formed in the MRAM cell region 102.

Then, as shown in FIG. 3D, one first magnetization pinning layer 50a is formed over the entire surface of the substrate by a sputtering method. For example, an alloy of Pt and Co or a stacked film formed by alternately stacking Pt and Co is formed as the first magnetization pinning layer 50a.

Then, as shown in FIG. 3E, an SiN protective film 108 and an SiO$_2$ hard mask 109 are formed successively in this order over the first magnetization pinning layer 50a and a resist pattern 110 covering a portion for leaving the first magnetization pinning layer 50a is formed further thereover. Then, the SiO$_2$ hard mask 109, the SiN protective film 108, and the first magnetization pinning layer 50a are dry etched by using the resist pattern 110 as a mask. Then, when the resist pattern 110 and the SiO$_2$ hard mask 109 left after the dry etching are removed, a state as shown in FIG. 3(F) is obtained. In this step, the stacked cap film 107 comprising the SiN (or SiCN) film 107c/SiO$_2$ film 107b/SiCN film 107a is left in the CMOS logic region 101.

Figure 4G:
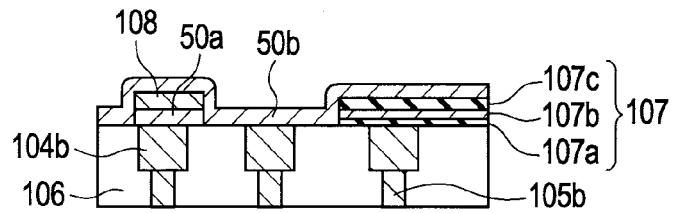
FIG. 4G to FIG. 4L show an example of a manufacturing flow chart of a semiconductor device of this embodiment.

Then, as shown in FIG. 4G, another first magnetization pinning layer 50b is formed over the entire surface of the substrate by a sputtering method. As the first magnetization pinning layer 50b, an alloy of Pt and Co, or a stacked film formed by alternately stacking Pt and Co, etc. formed in the same manner as in the one first magnetization pinning layer 50a is formed. For finally making the direction of magnetization just opposing to that of the one first magnetization pinning layer 50a, while it is necessary to provide a difference in the magnetization coercive force, the difference can be provided in the magnetization coercive force, for example, by changing the film thickness, deposition condition, etc.

Figure 4H:
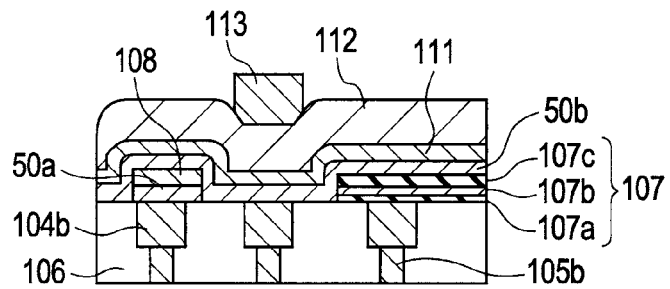
Figure 4I:
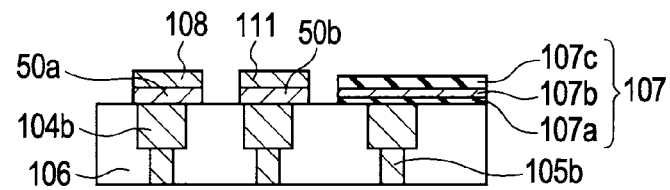

Then, as shown in FIG. 4H, an SiN protective film 111 and an SiO$_2$ hard mask 112 are formed successively in this order over the first magnetization pinning layer 50b, and a resist pattern 113 for covering the portion to leave the first magnetization pinning layer 50b is formed thereover. Then, the SiO$_2$ hard mask 112, the SiN protective film 111, and the first magnetization pinning layer 50b are dry etched by using the resist pattern 113 as a mask. Then, when the resist pattern 113 and the SiO$_2$ hard mask 112 left after dry etching are removed, a state as shown in FIG. 4I is obtained. In this case, a stacked cap film 107 comprising SiN (or SiCN) film 107c/SiO$_2$ film 107b/SiCN film 107a is left in the CMOS logic region 101.

Figure 4J:
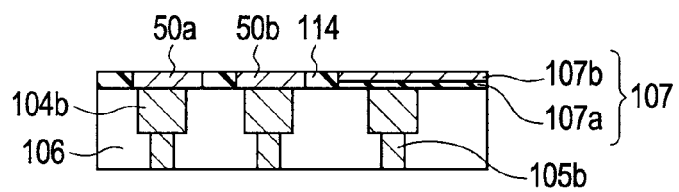

Then, after forming stacked film 114 comprising SiN and SiO$_2$ over the entire surface of the substrate in a state shown in FIG. 4I, CMP and dry etching are performed to expose the first magnetization pinning layers 50a and 50b as shown in FIG. 4J. By the processing, the SiN (SiCN) film 107c of the stacked film 107 is also removed. In this case, an extremely thin SiN film may be left on the surface. In this step, the extremely thin SiN film left in the sputtering chamber can be removed by Ar sputtering or the like before subsequent forming of the free magnetization layer.

Figure 4K:
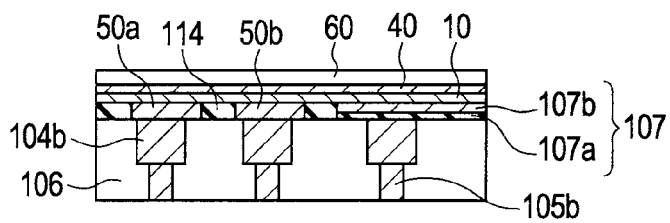
Figure 4L:
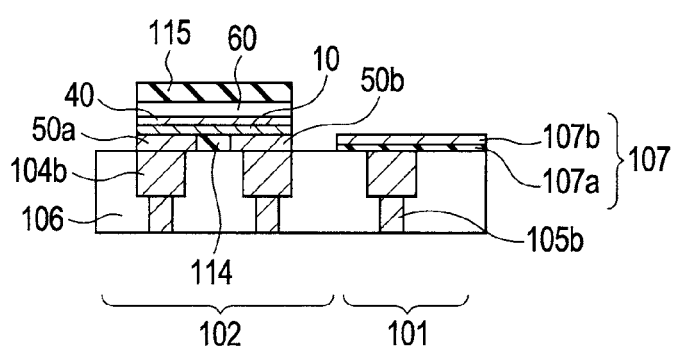

Then, as shown in FIG. 4K, a free magnetization layer 10, a non-magnetic layer (tunnel barrier layer) 40, and a second magnetization pinning layer 60 are formed in this order over the entire surface of the substrate by a sputtering method. Then, an SiN protective film 115 and an SiO$_2$ hard mask are formed in this order thereover, and a desired resist pattern is formed further thereover. Then, the SiO$_2$ hard mask, the SiN protective film 115, the second magnetization pinning layer 60, the non-magnetic layer (tunnel barrier layer) 40, the free magnetization layer 10, and the stacked film 114 are dry etched by using the resist pattern as a mask. Then, when the resist pattern and the SiO$_2$ hard mask left after the dry etching are removed, a state as shown in FIG. 4L is obtained. In this step, a laminate cap film 107 comprising SiO$_2$ film 107b/SiCN film 107a is left in the CMOS logic region 101.

Figure 5M:
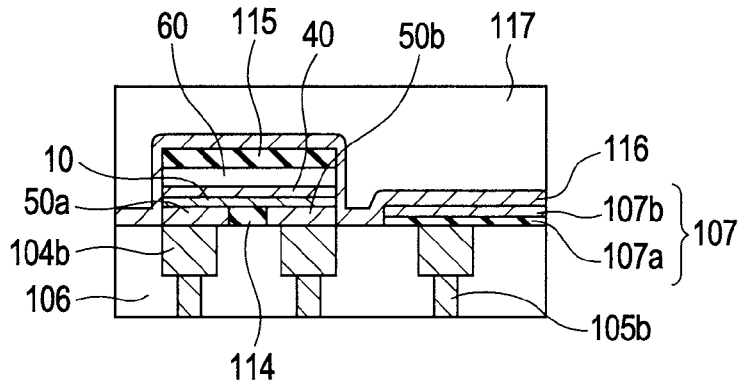
FIG. 5M to FIG. 5P show an example of a manufacturing flow chart of a semiconductor device of this embodiment.
Figure 5N:
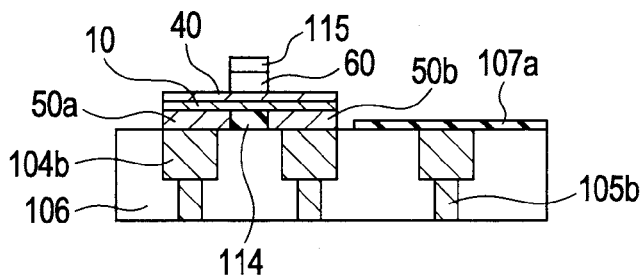

Then, after forming an SiN film 116 and an SiO$_2$ film 117 in this order over the entire surface of the substrate in the state shown in FIG. 4L, when they are planarized by CMP, a state shown in FIG. 5M is obtained. Then, a resist pattern covering portion for removing the second magnetization pinning layer 60 is formed over the SiO$_2$ film 117. Then, the SiO$_2$ film 117, the SiN film 116, the SiN protective film 115, the second magnetization pinning layer 60, and the SiO$_2$ film 107b are dry etched by using the resist pattern as a mask. The dry etching is stopped at the non-magnetic layer (tunnel barrier layer) 40 and controlled so as not to expose the free magnetization layer 10. Then, when the resist pattern and the SiO$_2$ film 117 left after the dry etching are removed, a state as show in FIG. 5N is obtained. In this step, a stacked cap film 107 comprising the SiCN film 107a is left in the CMOS logic region 101.

Figure 5O:
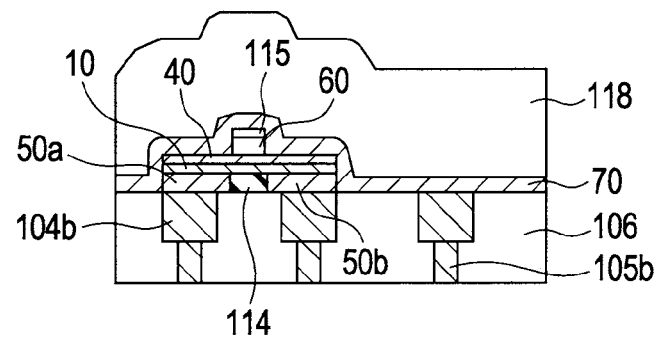
Figure 5P:
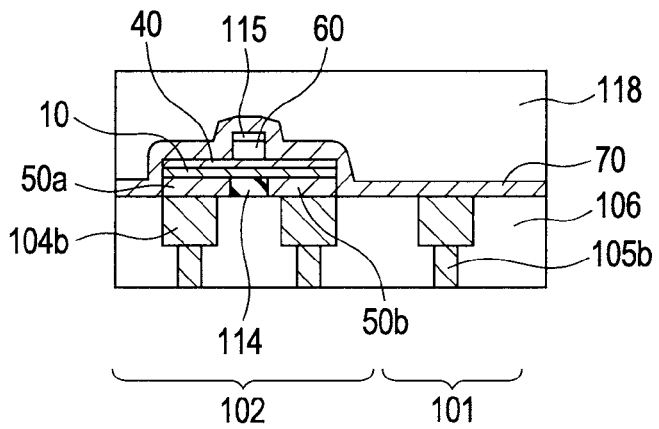

Then, as shown in FIG. 5O, after forming a protective film 70 comprising, for example, a SiCN film over the entire surface of the substrate, a second interlayer insulating film 118 is formed thereover. Then, when the second interlayer insulating film 118 is planarized by CMP, a state shown in FIG. 5P is obtained. The thickness of the second interlayer insulating film 118 after planarization is controlled so as to be identical with that of the first interlayer insulating film 106.

Figure 6Q:
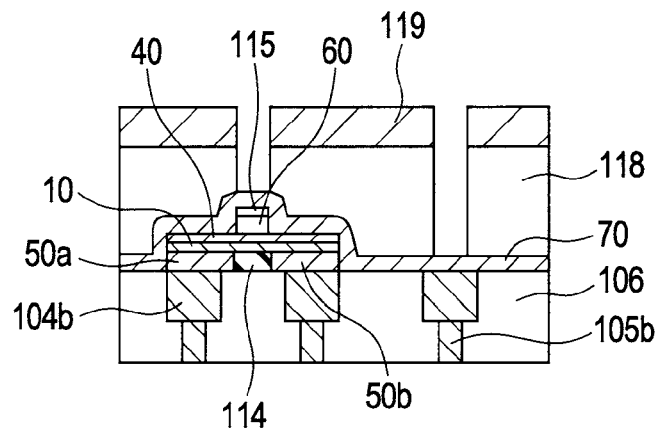
FIG. 6Q to FIG. 6S show an example of a manufacturing flow chart of a semiconductor device of this embodiment.
Figure 6R:
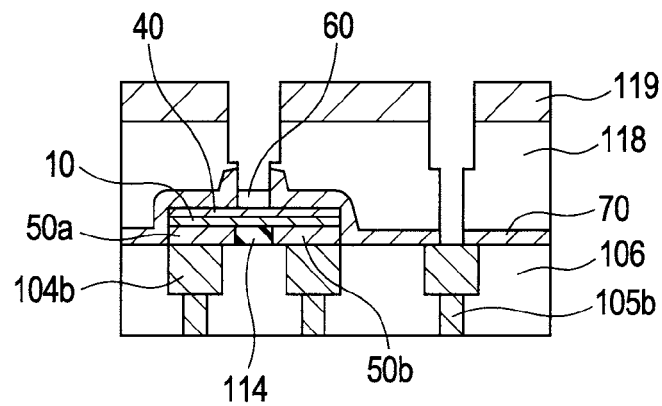

Then, as shown in FIGS. 6Q and 6R, after forming an SiO$_2$ hard mask 119 over the second interlayer insulating film 118, via hole fabrication and wiring trench fabrication are performed in accordance with a usual wiring fabrication process.

While an example of a via hole-first fabrication process of at first fabricating a via hole is shown, the fabrication method is not restricted to the via hole-first process, but a trench-first process of at first fabricating the wiring trench pattern can also be used.

Figure 6S:
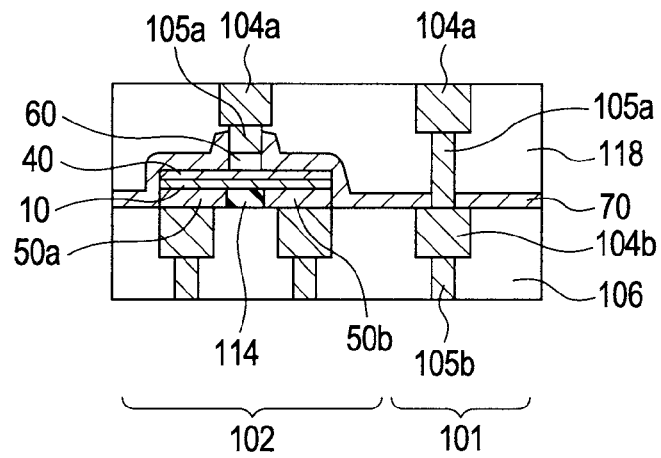

Then, when a barrier metal and Cu are buried in the wiring trench and the via hole and excess Cu and the barrier metal are removed by CMP, a logic-matched wiring layer in which the MRAN is formed is formed as shown in FIG. 6S. According to the process, a via hole (second via hole) 105a electrically connected with the second magnetization pinning layer 60 and a wiring (second wiring) 105b electrically connected with the via hole can be formed in the MRAM cell region 102, as well as a via hole (third via hole) 105a electrically connected with the wiring (first wiring) 104b and a wiring (third wiring) 105b electrically connected with the via hole can be formed in the CMOS region 101 by the identical processing.

Figure 13:
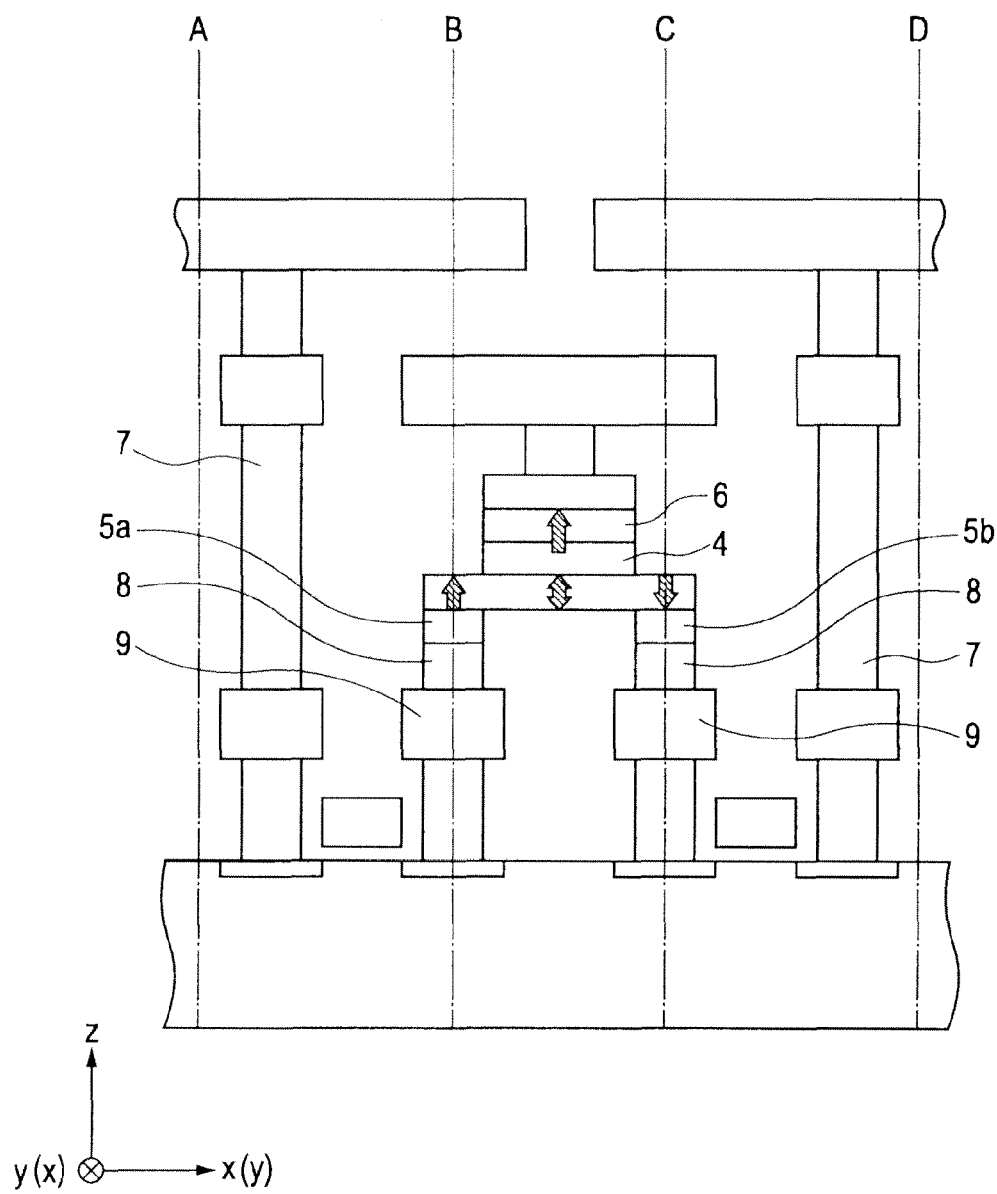
FIG. 13 is an example of a cross sectional view of an existent semiconductor device.

In this embodiment, the MRAM is formed in contact with the wiring in the lower layer. That is, different from the existent technique shown in FIG. 13, the contact 8 (or via hole) is not situated between the wiring in the lower layer and the MRAM in this embodiment. According to the embodiment, since the thickness of the layer in which the MRAM is formed can be reduced by so much as the contact 8 (or via hole) is not interposed, the height of the layer can be made identical with the height of the layer in which the MRAM is not formed. In this process, the height of the wiring and the via hole formed in each of the layers can also be made identical. As a result, this can avoid disadvantage that the multilayered wiring structure on the side of the logic is changed by the MRAM formed in the multilayered wiring layer.

Usually, it is considered that the contact 8 (or via hole) is interposed between the lower wiring layer and the MRAM due to the reason, for example, of suppressing corrosion of the wiring in the lower layer upon forming the MRAM device. In a case where the contact 8 (or via hole) is not situated between the wiring in the lower layer and the MRAM, disadvantage such as corrosion of Cu may possibly be caused at the surface of the lower layer wiring. Such disadvantage is avoided in this embodiment by covering the surface of the lower wiring layer in the logic region by using the stacked cap film 107.

Further, according to this embodiment, the material arrangement for the multilayered wiring on the side of the logic does not change due to the MRAM formed in the multilayered wiring layer.

Further, according to this embodiment, since the upper surface and the lateral side of the MRAM are covered with a film comprising SiCN, SiN or a stacked structure thereof having water proofness and Cu diffusion resistance, the stability of the MRAM is improved.

Second Embodiment

<Configuration of Semiconductor Device>

Figure 7A:
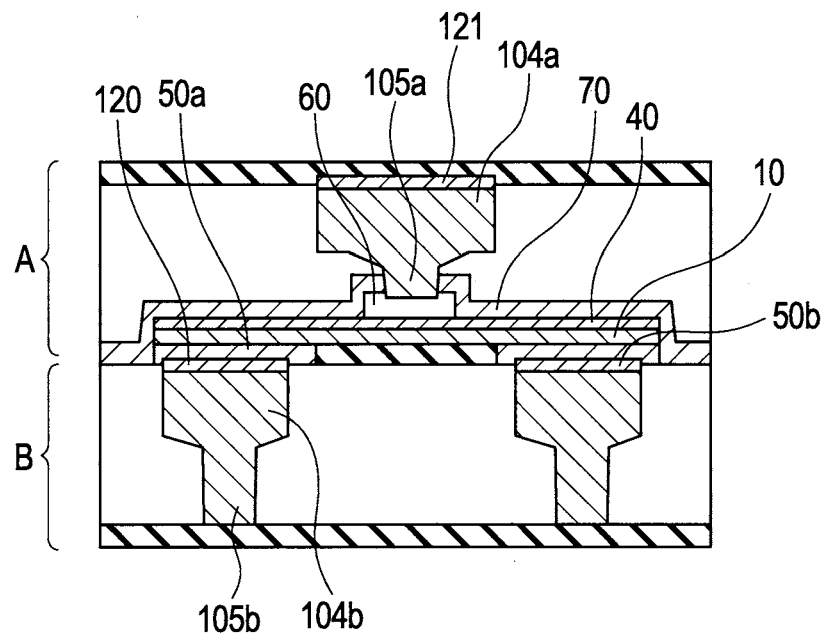
FIG. 7A and FIG. 7B show an example of cross sectional views of the semiconductor device of this embodiment.
Figure 7B:
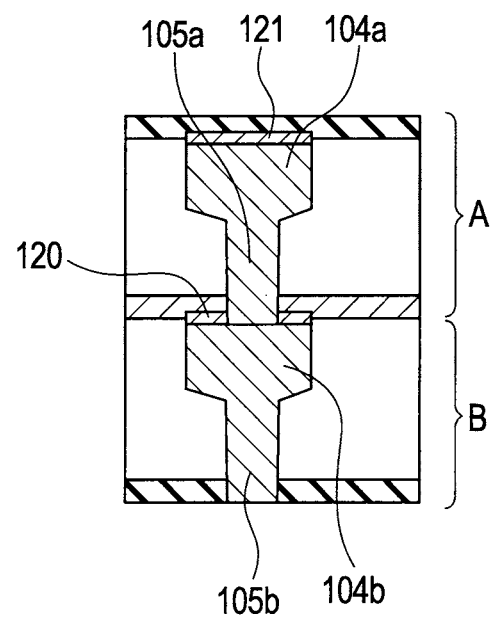

FIGS. 7A and 7B show enlarged cross sectional views for extracted main portion of a wiring layer A and a wiring layer B of the semiconductor device of this embodiment. FIG. 7A shows an MRAM cell region and FIG. 7B shows a CMOS logic region.

The semiconductor device of this embodiment is different from the first embodiment in that a metal cap films 120 and 121 are present on the surface of wirings 104a and 104b. Other configurations of a semiconductor device of this embodiment are identical with those in the first embodiment.

According to the semiconductor device of this embodiment, a metal cap film 120 is situated between the wiring 104b and first magnetization pinning layers 50a and 50b. The metal cap film 120 can be, for example, a Co-containing film, a W-containing film, or an Ru-containing film. Further, the thickness of the metal cap film 120 can be, for example, 5 nm. The metal cap film 120 can function as a portion of the first magnetization pinning layers 50a and 50b.

<Method of Manufacturing Semiconductor Device>

Then, an example of a method of manufacturing the semiconductor device of this embodiment described above is to be described with reference to FIGS. 8A to 8C. The drawings are cross sectional views showing a flow for manufacturing the semiconductor device of this embodiment in which an MRAM cell region 102 is formed on the left and a CMOS logic region 101 is formed on the right in the drawing.

Figure 8A:
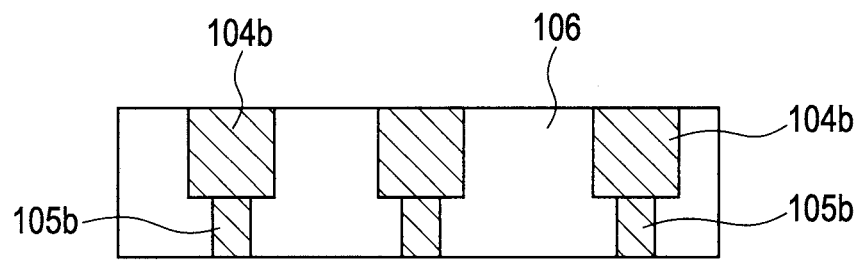
FIG. 8A to FIG. 8C show an example of a manufacturing flow chart of the semiconductor device of this embodiment.
Figure 8B:
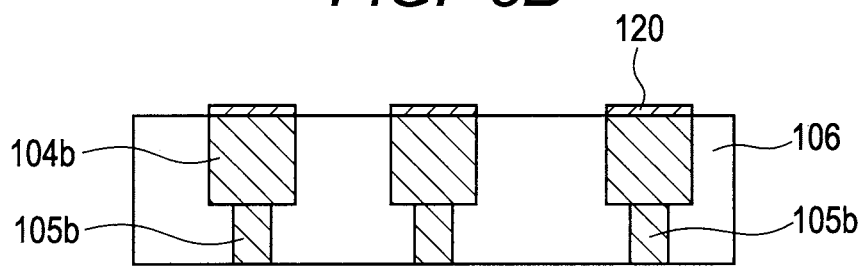

At first, as shown in FIG. 8A, a via hole 105b and a wiring 104b are formed in a first interlayer insulating film 106 formed over a substrate (not illustrated) by a usual process for forming a multilayered wiring (dual damascene) process. The drawings show the state of burying Cu as the via hole 105b and the wiring 104b in the first interlayer insulating film 106 and then planarizing the same by CMP. Then, as shown in FIG. 8B, a metal cap film 120 is selectively formed over the wiring 104b by electroless plating or selective CVD.

Figure 8C:
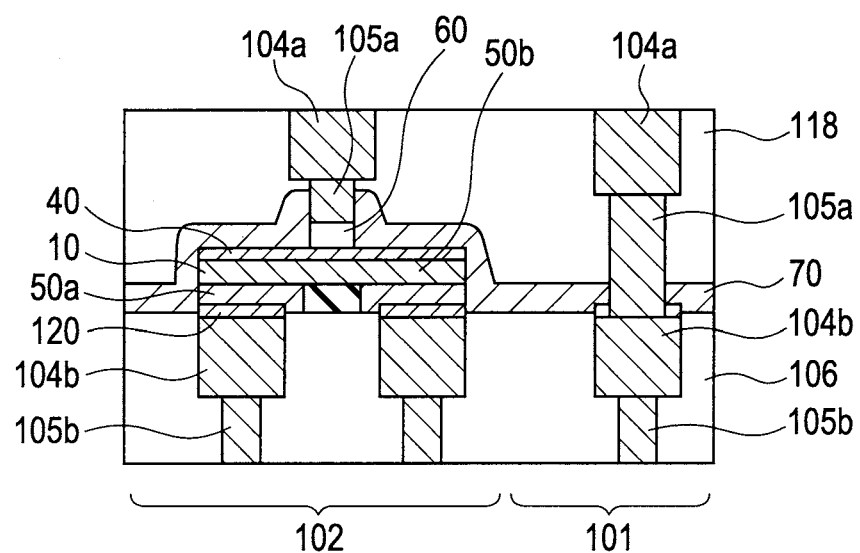

Subsequently by performing the same processing as that explained for the first embodiment, a state shown in FIG. 8C is obtained. Then, a metal cap film 120 (not illustrated) is formed selectively over the wiring 104a by electroless plating or selective CVD.

According to this embodiment, the following function and effect can be obtained in addition to the function and effect of the first embodiment.

(1) According to this embodiment, when the wiring 104b in the MRAM cell region 102 is exposed by dry etching, since the surface of the wiring 104b is covered with the metal cap film 120, corrosion of the wiring 104b with an etching gas or peeling liquid can be suppressed.

(2) Further, according to this embodiment, electron migration (EM) resistance of the wirings 104a and 104b can be improved remarkably by forming the metal cap films 120 and 121 over the wirings 104a and 104b.

Figure 9:
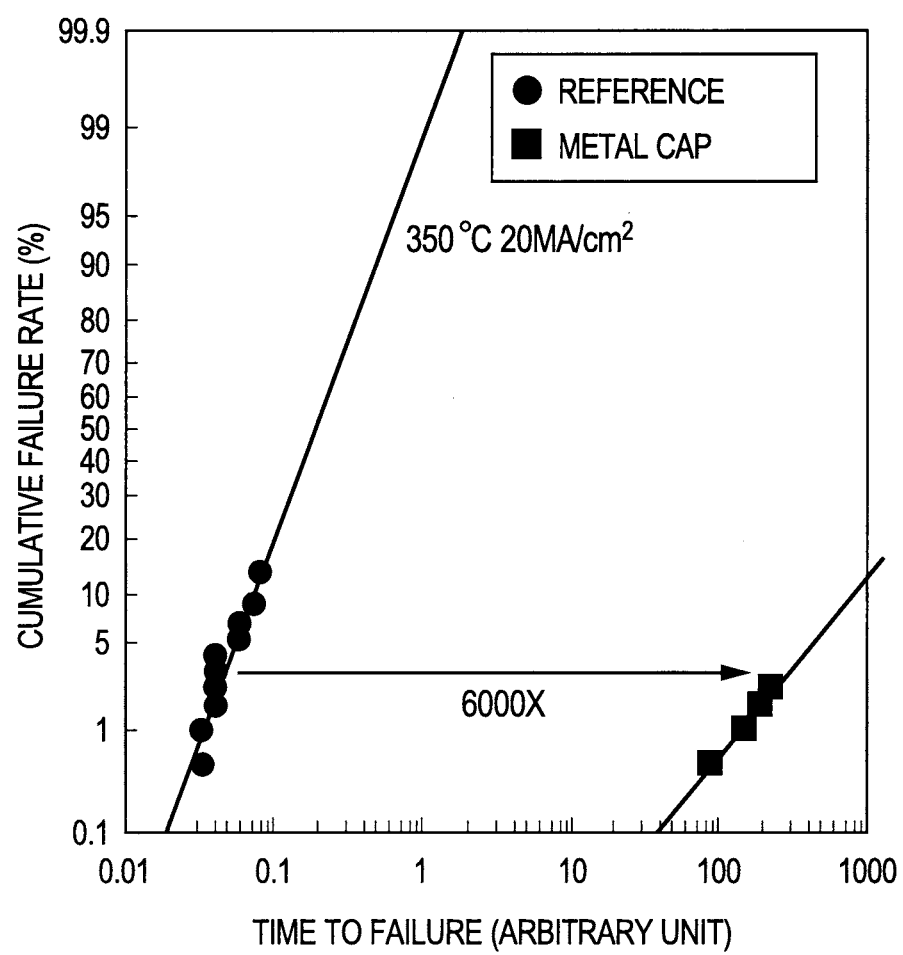
FIG. 9 is a graph explaining the function and the effect of the semiconductor device of the embodiment.

FIG. 9 is a graph showing the cumulative failure rate of disconnection failure of copper-containing wirings just below the via hole due to EM under the reference conditions of not using the metal cap films 120 and 121 and conditions of using the metal cap films 120 and 121 respectively. As can be seen from the graph, EM resistance is improved as much as by 6,000 times by using the metal cap films 120 and 121.

In the MRAM, EM-induced wiring disconnection is caused by write current by which the writing cycles to the MRAM may possibly be restricted. According to this embodiment, since the metal cap films 120 and 121 are formed over the wirings 104a and 104b, the EM resistance of the wiring can be improved and, as a result, restriction to the writing cycles can be overcome.

(3) Further, according to this embodiment, the EM resistance of the wirings 104a and 104b is improved remarkably and formation of voids in the wiring due to write current can be suppressed to enable RAM operation.

Figure 10A:
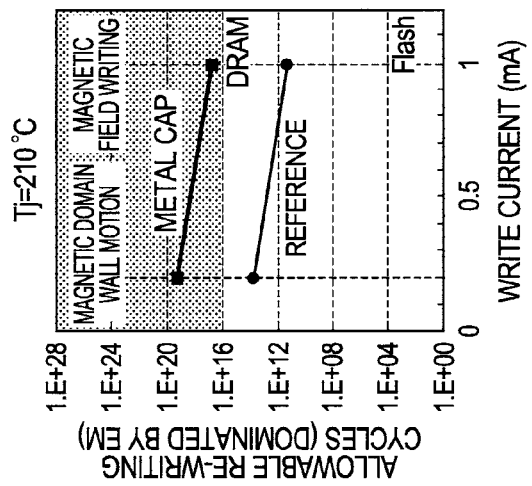
FIG. 10A to FIG. 10C are graphs explaining the function and the effect of the semiconductor device of the embodiment.
Figure 10B:
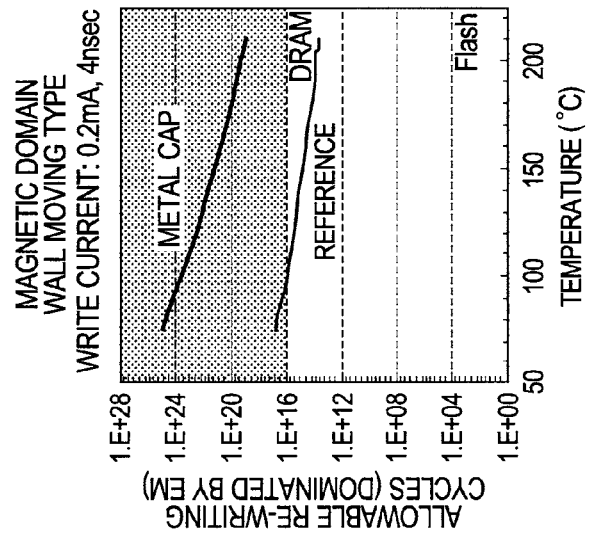
Figure 10C:
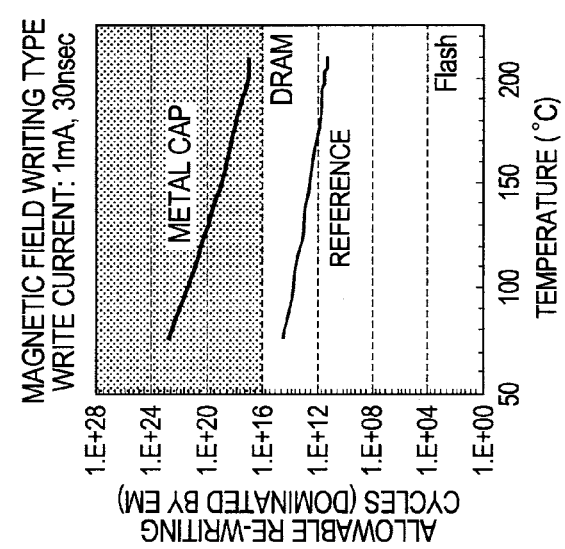
Figure 11A:
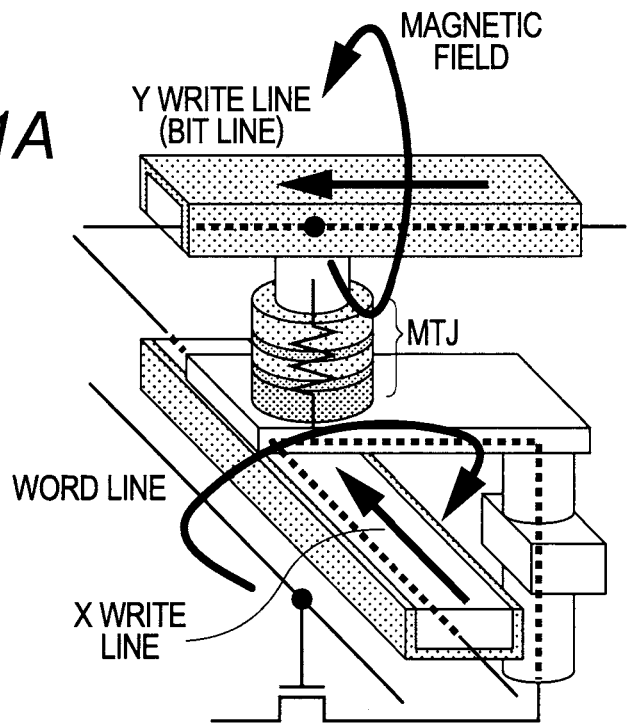
Figure 11B:
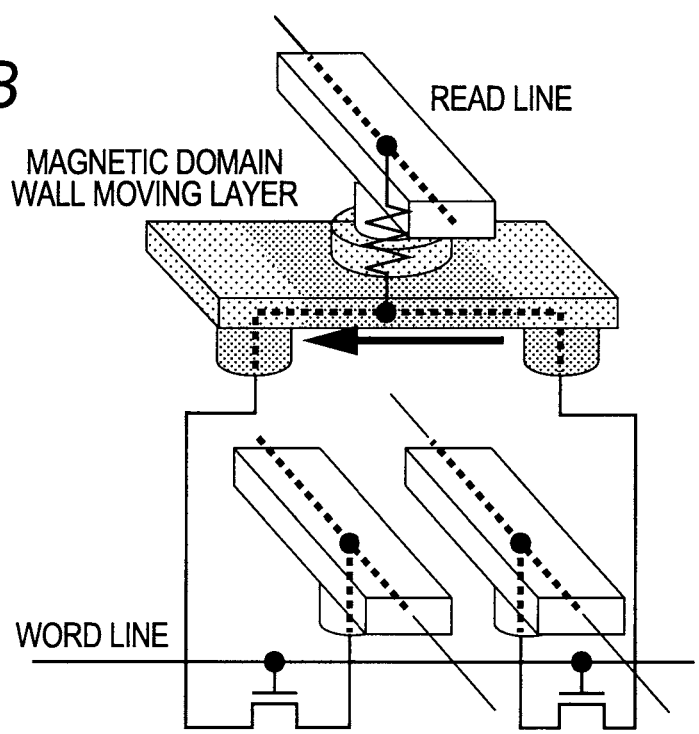
Figure 12:
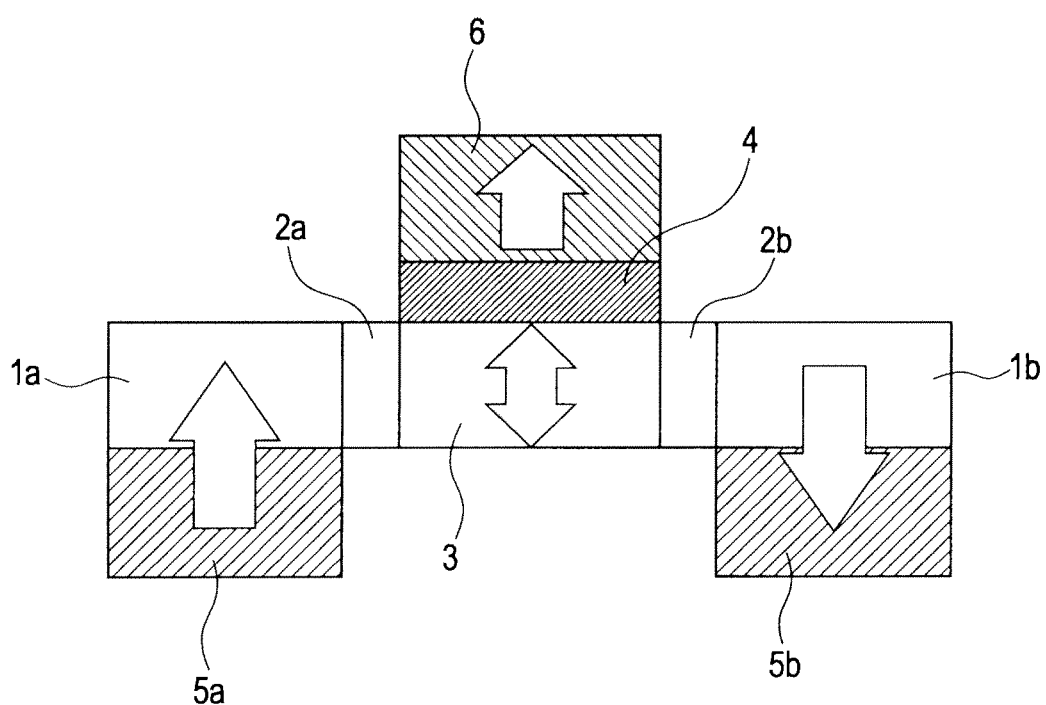
FIG. 12 is an example of a cross sectional view of an existent semiconductor device.

FIGS. 10A to 10C show the advantageous effect when applying the metal caps 120 and 121 to the writing wirings of MRAM. FIG. 11A is a schematic view of a magnetic field writing type and FIG. 11B shows a schematic view of a magnetic domain wall moving type. In the magnetic field writing type of switching spin (reversal) of MTJ (Magnetic Tunnel Junction) depending on the direction of the magnetic field, a larger current is necessary compared with that of the magnetic domain wall moving type.

FIG. 10A shows the dependence of the write cycle on operation temperature by EM rate determination in the writing wiring in a case of applying a write current at 1 mA for 30 nsec assuming the magnetic field writing type for the case of presence or absence of a metal cap. In the graph "reference" shows data corresponding to the absence of metal cap. This presumption is identical also for FIGS. 10B and 10C.

FIG. 10B shows the dependence of the writing cycle on operation temperature in a case of applying a write current at 0.2 mA for 40 nsec assuming the magnetic domain wall type for the case of presence or absence of a metal cap. FIG. 10C shows the writing cycles at 210° C. for each of the magnetic field writing type and the magnetic domain wall moving type respectively.

As can be seen from FIGS. 10A and 10C, writing cycle of $1 \times E^{16}$ times of DRAM cannot be attained in the magnetic field writing type of large write current under the condition of not using the metal cap. However, when the metal cap is used, as shown in FIG. 10A, the writing cycle of $1 \times E^{16}$ times of DRAM can be attained as shown in FIG. 10A. Further, when the metal cap is used, a writing cycle of $1 \times E^{16}$ times of DRAM can be attained as shown in FIG. 10C even at a high temperature circumference of 210° C.

As can be seen from FIGS. 10B and 10C, in the magnetic domain wall moving type, DRAM writing cycles of $1 \times 10^{16}$ times cannot be attained when the operation temperature exceeds about 100° C. under the conditions of not using the metal cap. However, as shown in FIG. 10B, the DRAM writing cycles of $1 \times 10^{16}$ times can be attained when the metal cap is used. Further, as shown in FIG. 10C, the DRAM writing cycles of $1 \times E^{16}$ times can be attained even in a high temperature circumstance of 210° C. when the metal cap is used.

As described above, restriction on the writing cycles due to the EM rate determination can be eliminated by applying the metal cap to the writing wiring, and the RAM operation is possible even at a high temperature of 210° C. and application to a high temperature circumstance such as in car-mounted microcomputers can be expected.

(4) Further, according to the method of manufacturing the semiconductor device of this embodiment, disadvantage caused by temperature lowering of the wiring process can be moderated.

That is, due to lowering of density, etc. along with temperature lowering of the wiring process, the interlayer insulating film tends to absorb moisture to result in a possibility that the wiring tends to undergo corrosion. According to this embodiment, such disadvantage can be moderated by the presence of the metal cap.

Third Embodiment

<Configuration of Semiconductor Device>

The configuration of the semiconductor device of this embodiment is identical with that of the first embodiment or the second embodiment, excepting that the interlayer insulating film is an SiOCH film and the compositional ratio represented by C/Si is 1 or more and 10 or less.

<Method of Manufacturing Semiconductor Device>

The method of manufacturing the semiconductor device according to this embodiment is identical with that of the first embodiment or the second embodiment except for forming the interlayer insulating film by plasma polymerizing reaction by using a starting material having a cyclic organic silica structure represented by the following formula (1).

[Chem. 1]

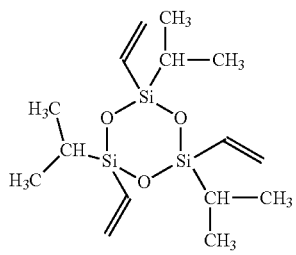

(1)

As means for forming a low-k insulating film, it may be considered means of forming a porous insulating layer by evaporating a substance buried in the insulating layer by heating and forming voids in the insulating layer. However, such means requires a temperature for the heating of 400° C. or higher. Since the heating resistance of MRAM is defined as 350° C. or lower, the characteristics of the MRAM may possibly be degraded when the means is adopted.

According to the configuration of this embodiment, since the low-k insulating layer can be formed at 300° C. or lower, this embodiment can suppress the disadvantage when the MRAM is exposed to a temperature of 350° C. or higher and can suppress disadvantages such as degradation of characteristic due to thermal hysteresis and, as a result, improve the stability of the MRAM.

Further, according to this embodiment, since the average void diameter in the interlayer insulating film can be as fine as 0.3 nm or more and 0.7 nm or less, and a structure in which individual voids are independent of each other tends to be attained, diffusion of gas, moisture, metal, etc. into the interlayer insulating film is suppressed. Accordingly, a multilayered wiring and MRAM at high reliability can be obtained.

Further, according to this embodiment, since the concentration of C is high in the interlayer insulating film formed of the SiOCH film as the compositional ratio represented by C/Si is 1 or greater, high resistance to the plasma treatment during process can be attained, so that the capacitance fluctuation in the wiring is small and stable wiring performance and high yield can be attained.

What is claimed is:

1. A semiconductor device having a multilayered wiring layer formed over a substrate,
    wherein a first layer contained in the multilayered wiring layer has:
    a first interlayer insulating film; and
    a plurality of first via holes buried in the first interlayer insulating film, and a plurality of first wirings buried in the first interlayer insulating film, connected with the first via holes, and exposed at the surface from the first interlayer insulating film, and
    wherein a second layer contained in the multilayered wiring layer and situated just over has, in a first region,
    an MRAM (magnetoresistive random access memory) having at least two first magnetization pinning layers in contact with the first wiring and insulated from each other,
    a free magnetization layer overlapping the two first magnetization pinning layer in a plan view and connected with the first magnetization pinning layers,
    a non-magnetic layer situated over the free magnetization layer, and
    a second magnetization pinning layers situated over the non-magnetic layer;
    a second interlayer insulating film covering the MRAM;
    a second via hole buried in the second interlayer insulating film and connected with the second magnetization pinning layers; and
    a second wiring buried in the second interlayer insulating film, connected with the second via hole, and exposed at the surface from the second interlayer insulating film.

2. The semiconductor device according to claim 1, wherein the height of the first layer and the height of the second layer are identical.

3. The semiconductor device according to claim 1, wherein the MRAM is not situated in a second region of the second layer, and the second interlayer insulating film formed over the first layer, a third via hole buried in the second interlayer insulating film and connected with the first wiring, and a third wiring buried in the second interlayer insulating film and connected with the third via hole are situated in the second region of the second layer.

4. The semiconductor device according to claim 1,
    wherein the device further has a protective film covering the MRAM, and
    wherein the protective film comprises an SiN film, an SiCN film, or a stacked film comprising the same.

5. The semiconductor device according to claim 4, wherein the protective film covers the upper surface and the lateral side of the MRAM.

6. The semiconductor device according to claim 4, wherein the protective film extends in the second region of the second layer and situated between the first layer and the second interlayer insulating film.

7. The semiconductor device according to claim 1, wherein the exposed surface of the first and the second wirings is covered with the metal cap film.

8. The semiconductor device according to claim 7, wherein the metal cap film covering the first wiring forms a portion of the MRAM.

9. The semiconductor device according to claim 1, wherein the first and the second interlayer insulating films comprises SiCOH.

10. The semiconductor device according to claim 9, wherein the first and the second interlayer insulating film comprising SiCOH have a C/Si ratio of 1 or more and less than 10.

* * * * *